United States Patent
Apalkov et al.

(10) Patent No.: US 8,890,569 B2
(45) Date of Patent: Nov. 18, 2014

(54) METHOD AND SYSTEM FOR PROVIDING A NONVOLATILE LOGIC ARRAY

(75) Inventors: Dmytro Apalkov, San Jose, CA (US); Eugene Chen, Fremont, CA (US); Kaveh Milaninia, San Jose, CA (US)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 308 days.

(21) Appl. No.: 13/557,376

(22) Filed: Jul. 25, 2012

(65) Prior Publication Data

US 2014/0225643 A1    Aug. 14, 2014

Related U.S. Application Data

(60) Provisional application No. 61/512,163, filed on Jul. 27, 2011.

(51) Int. Cl.
*B82Y 25/00* (2011.01)
*H01L 43/02* (2006.01)
*H01L 27/22* (2006.01)
*H03K 19/08* (2006.01)
*H01L 43/12* (2006.01)

(52) U.S. Cl.
CPC .............. *H03K 19/08* (2013.01); *H01L 27/224* (2013.01); *H01L 43/12* (2013.01); *Y10S 977/74* (2013.01)
USPC .............. 326/41; 365/158; 365/171; 977/740

(58) Field of Classification Search
USPC .......... 326/41, 28, 37, 39, 104; 365/158, 171; 257/421; 977/708, 740
See application file for complete search history.

(56) References Cited

U.S. PATENT DOCUMENTS

2007/0019337 A1*  1/2007  Apalkov et al. ............ 360/324.1
2012/0217997 A1*  8/2012  Kaneko ..................... 326/38

OTHER PUBLICATIONS

M.T. Alam, et al., "On-chip Clocking for Nanomagnet Logic Devices," IEEE Transactions on Nanotechnology, vol. 9, No. 3, May 2010, pp. 348-351.
E. Varga, et al., "Programmable Nanomagnet-Logic Majority Gate," Device Research Conference, Jun. 2010, pp. 85-86.
E. Varga, et al., "Experimental Demonstration of Non-Majority, Nanomagnet Logic," Device Research Conference, Jun. 2010, pp. 87-88.

* cited by examiner

*Primary Examiner* — Daniel D Chang
(74) *Attorney, Agent, or Firm* — Convergent Law Group LLP

(57) ABSTRACT

A method and system provide and program a nonvolatile logic device. The nonvolatile logic device includes input and output magnetic junctions and at least one magnetic junction between the input and output magnetic junctions. The input magnetic junction includes an input junction free layer having an input junction easy axis. The input magnetic junction may be switchable using a current driven through the magnetic junction. The output magnetic junction includes an output junction free layer having an output junction easy axis. Each of the magnetic junction(s) includes a free layer having an easy axis. The input magnetic junction is magnetically coupled to the output magnetic junction through the magnetic junction(s). In some aspects, the method includes switching the magnetic moment(s) of the input magnetic junction from a first state to a second state, applying and then removing magnetic field(s) along the hard axis of the at least one magnetic junction.

30 Claims, 8 Drawing Sheets

METHOD AND SYSTEM FOR PROVIDING A NONVOLATILE LOGIC ARRAY

CROSS-REFERENCE TO RELATED APPLICATIONS

This application claims the benefit of provisional Patent Application Ser. No. 61/512,163, filed Jul. 27, 2011, assigned to the assignee of the present application, and incorporated herein by reference.

GOVERNMENT RIGHTS

This invention was made with U.S. Government support under Grant/Contract No. HR0011-10-C-0160 awarded by DARPA. The U.S. Government retains certain rights in this invention.

BACKGROUND

FIGS. 1A-1B depict a conventional nonvolatile logic device 10 formed using an array of magnetic junctions 12, 14, 16, 18, 20, 22, and 24. The junction 12 is an input magnetic junction 12. Also shown are an output magnetic junction 22 and intermediate junctions 14, 16, 18, and 20. A biasing junction 24 is also shown. However, an output electrode is coupled with the output magnetic junction 22.

The magnetic junctions 12, 14, 16, 18, 20, and 22 are typically tunneling magnetoresistive junctions. Thus, each junction 12, 14, 16, 18, 20, and 22 typically includes a pinning layer, a pinned layer, a nonmagnetic tunneling barrier layer, and a free layer. The pinned layer has its magnetization pinned in place by the pinning layer. The magnetizations of the free layers are shown in FIGS. 1A-1B and are typically free to move. The junctions 12, 14, 16, 18, 20, and 22 typically share a tunneling barrier layer, pinned layer, and pinning layer. Thus, the portions of the junctions 12, 14, 16, 18, 20, and 22 shown in FIGS. 1A-1B correspond to the free layer. As can be seen in FIG. 1A, the easy axis (corresponding to the shape anisotropy) for the free layer of the input magnetic junction 12 is perpendicular to the easy axes of the remaining magnetic junctions 14, 16, 18, 20, and 22. The remaining magnetic junctions 14, 16, 18, 20, and 22 are substantially identical. Thus, the magnetic junctions 14, 16, 18, 20, and 22, typically have the same shape anisotropy, magnetic moment, and other magnetic properties. The pinned layer typically has its magnetization oriented along the easy axis of the junctions 14, 16, 18, 20, and 22. Thus, the pinned layer is oriented perpendicular to the easy axis of the junction 12.

FIG. 1A depicts the nonvolatile logic device in a particular configuration. FIG. 1B depicts nonvolatile logic device 10 after switching to another configuration. The magnetic state of the input device 12 is changed, for example by passing the current through the structure causing spin transfer torque. An appropriate external magnetic field that saturates the magnetic junctions 14, 16, 18, 20, and 22 along their hard axes is applied. The result is that the magnetic moments of the junctions 14, 16, 18, 20, and 22 are aligned with the saturation field along the hard axis. As the external magnetic field is removed, the magnetic moment of the junctions 14, 16, 18, 20, and 22 cant away from the hard axis. For a situation in which the external magnetic field is removed at an appropriate time, the moments of the junctions 14, 16, 18, 20, and 22 would no longer be aligned in parallel. When the external field is completely removed, the state of the output junction will have switched because of the switch in the input junction, as is shown in FIG. 1B.

Although the conventional nonvolatile logic device 10 functions, there may be drawbacks. If an insufficient external field is applied, then the junctions 14, 16, 18, 20, and 22 do not saturate. The information in the input junction 12 may then not be transferred to the output junction 22. Alternatively, if too great an external magnetic field is applied, then the state of the input magnetic junction 12 may be changed. In addition, the time for which the external magnetic field is applied may be desired to be tightly controlled to ensure that switching is properly carried out. Thus, switching of the magnetic junction 11 may be unreliable and/or subject to tight tolerances.

BRIEF SUMMARY OF THE INVENTION

A method and system provide and program a nonvolatile logic device. The nonvolatile logic device includes an input magnetic junction, an output magnetic junction and at least one magnetic junction between the input magnetic junction and the output magnetic junction. The input magnetic junction includes an input junction free layer having an input junction easy axis. The input magnetic junction may be switchable using a current driven through the magnetic junction. The output magnetic junction includes an output junction free layer having an output junction easy axis. Each of the magnetic junction(s) includes a free layer having an easy axis. The input magnetic junction is magnetically coupled to the output magnetic junction through the magnetic junction(s). In some aspects, the method includes switching the magnetic moment(s) of the input magnetic junction from a first state to a second state, then applying at least one magnetic field along the hard axis of the at least one magnetic junction. The magnetic field is then removed.

DETAILED DESCRIPTION OF THE INVENTION

Figure 1A:
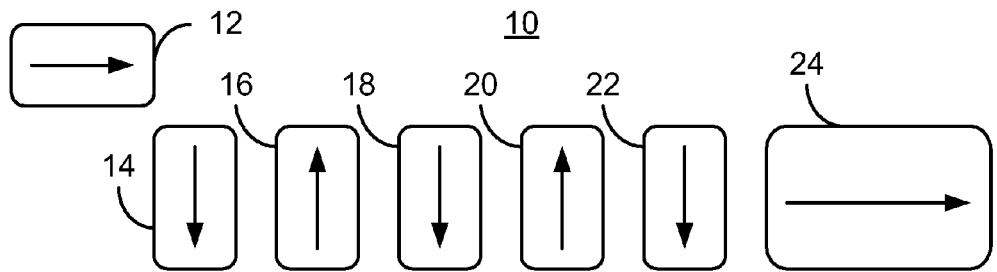
FIGS. 1A-1B depict a conventional nonvolatile logic device.
Figure 1B:
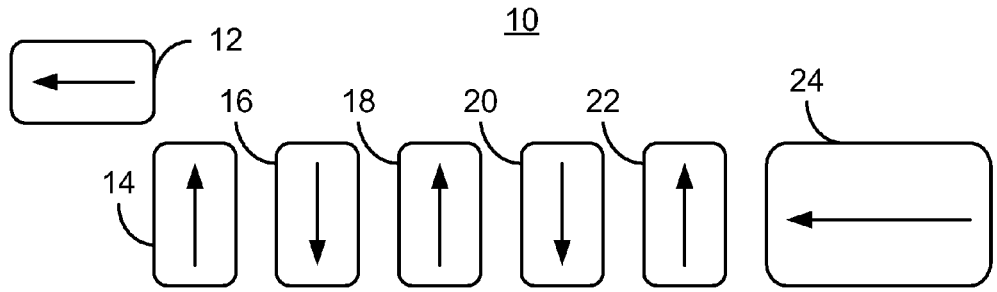

The exemplary embodiments relate to nonvolatile devices and magnetic junctions usable in such nonvolatile devices. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

The exemplary embodiments are described in the context of particular magnetic junctions and nonvolatile logic devices having certain components. One of ordinary skill in the art will readily recognize that the present invention is consistent with the use of magnetic junctions and nonvolatile logic devices having other and/or additional components and/or other features not inconsistent with the present invention. The method and system are also described in the context of current understanding of the spin transfer phenomenon, of magnetic anisotropy, and other physical phenomena. Consequently, one of ordinary skill in the art will readily recognize that theoretical explanations of the behavior of the method and system are made based upon this current understanding of spin transfer, magnetic anisotropy and other physical phenomena. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single magnetic junctions and substructures. However, one of ordinary skill in the art will readily recognize that the method and system are consistent with the use of magnetic memories having multiple magnetic junctions and using multiple substructures. Further, as used herein, "in-plane" is substantially within or parallel to the plane of one or more of the layers of a magnetic junction. Conversely, "perpendicular" corresponds to a direction that is substantially perpendicular to one or more of the layers of the magnetic junction.

Figure 2A:
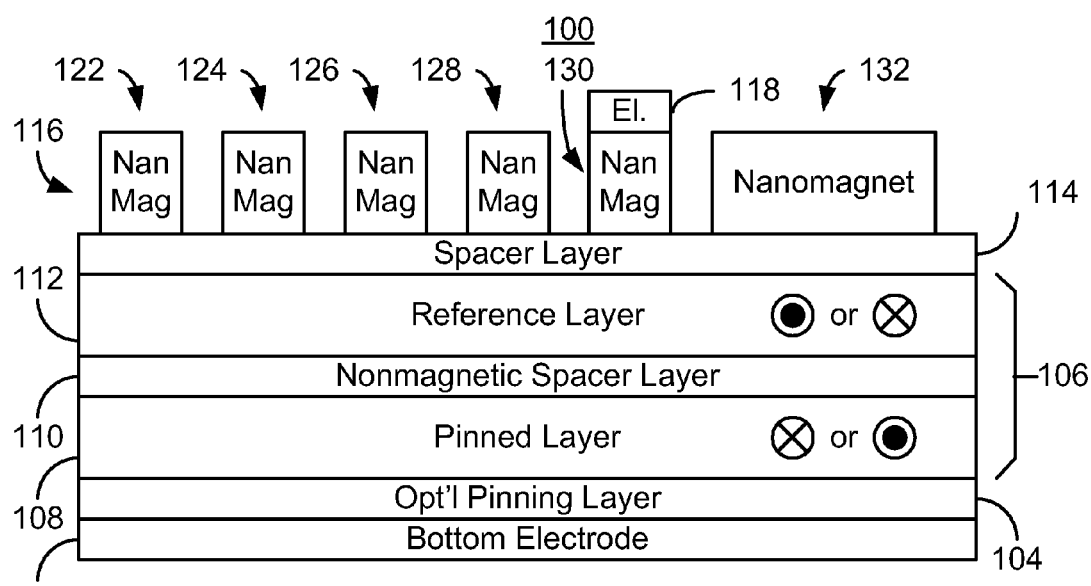
FIGS. 2A-2F depict cross-sectional and top views of an exemplary embodiment of a nonvolatile logic device.
Figure 2B:
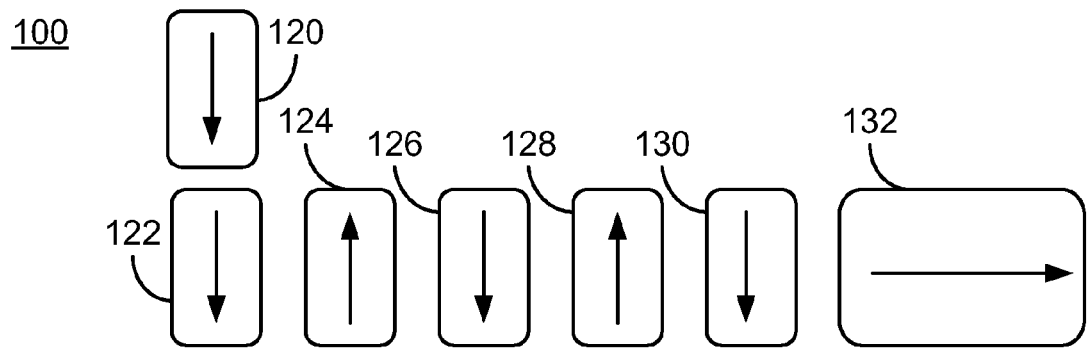

FIGS. 2A and 2B-2F depict a side view and top views of a nonvolatile logic device 100. The nonvolatile logic device 100 may be combined with like devices the appropriate electrical connection to form logic gates, such as NOT, AND, NAND, OR, and/or NOR gates. Referring to FIGS. 2A-2B, the nonvolatile logic device includes a bottom electrode 102 and an output electrode 118. The nonvolatile logic device includes magnetic junctions 120, 122, 124, 126, 128, 130, and 132. The magnetic junction 120 is an input magnetic junction. Information is input to the nonvolatile logic device 100 via the magnetic junction 120 by passing the current through junction 120. This current exerts spin transfer torque on the input magnet and switches its magnetization to the state, which depends on the direction of the applied current. The magnetic junction 130 is an output magnetic junction. Thus, an electrode 118 is also provided for the output magnetic junction 130. By reading the resistance of the magnetic junction 130, the state of the nonvolatile logic device 100 may be determined. The magnetic junction 132 is a biasing junction. The magnetic junctions 122, 124, 126, and 128 reside between the input magnetic junction 120 and the output magnetic junction 130. In the embodiment shown, four magnetic junctions 122, 124, 126, and 128 are shown. However, in another embodiment, another number of magnetic junctions may be provided between the input magnetic junction 120 and the output magnetic junction 130. The input magnetic junction 120 is coupled with the output magnetic junction 130 through the remaining magnetic junctions 122, 124, 126, and 128.

The magnetic junctions 120, 122, 124, 126, 128, 130, and 132 share a bottom electrode, optional pinning layer 104, pinned layer 106, and spacer layer 114. The free layers of the magnetic junctions 120, 122, 124, 126, 128, 130, and 132 are formed from layer 116. Thus, the top layers of the magnetic junctions 120, 122, 124, 126, 128, 130, and 132 are termed nanomagnets. In the embodiment shown, the pinned layer 106 is a synthetic antiferromagnet including a pinned layer 108, a nonmagnetic spacer layer 110 and a reference layer 112 that is magnetically coupled with the pinned layer 108. In the embodiment shown, the pinned layer 108 has its magnetization fixed, or pinned, by the optional pinning layer 104, which may be an antiferromagnet. In other embodiments, the pinned layer 106 may be a single layer, another multilayer, or other structure. In the embodiment shown, the magnetizations of the layers of the magnetic junctions 122, 124, 126, 128, 130, and 132 are in plane. However, in other embodiments, the magnetization(s) may be perpendicular to plane. The spacer layer 114 is nonmagnetic and may be a tunneling barrier layer such as crystalline MgO. In other embodiments, the spacer layer 114 may be conductive, or may have another structure. The layer 116 may be a single, ferromagnetic layer or may be a multilayer, for example a granular layer including conductive channels in an insulating matrix.

As can be seen in FIGS. 2A and 2B, the magnetic junctions 120, 122, 124, 126, 128, and 130 have vertical easy axes, along which the magnetizations lie. Thus, the magnetic junctions 120, 122, 124, 126, 128, and 130 have parallel easy axes. In the embodiment shown, the easy axes of the magnetic junctions 120, 122, 124, 126 128, and 130 correspond to the shape anisotropy of the magnetic junctions 120, 122, 124, 126 128, and 130. For example, in some embodiments, the long axis of the magnetic junctions 122, 124, 126, and 128 have a long axis of 90 nm and a short axis of 60 nm. In some such embodiments, the magnetic junction 120 has a long axis of 125 nm and a short axis of 60 nm. The junction 132 has a long axis of 135 nm (horizontally as shown in FIG. 2B) and a short axis of 90 nm. In some embodiments, the junctions 122, 124, 126, 128, 130, and 132 are 14 nm apart.

Figure 2C:
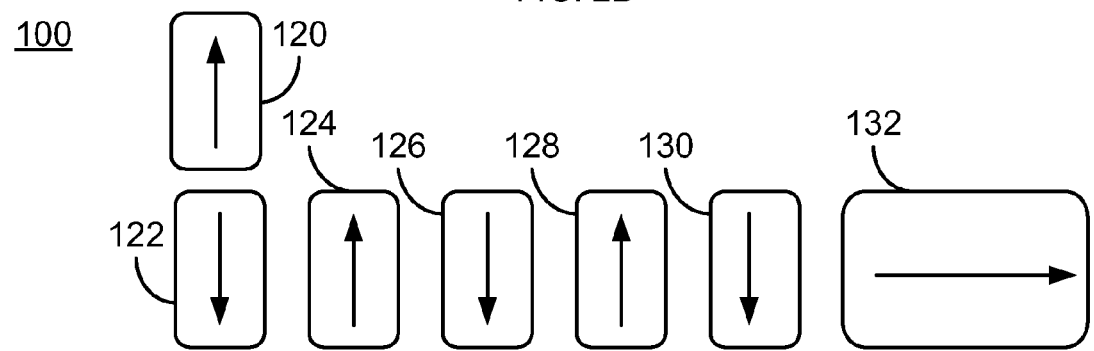

FIGS. 2C-2F depict the nonvolatile logic device 100 during switching. The magnetic junction 120 is first switched. This is depicted in FIG. 2C. In some embodiments, the input magnetic junction 120 may be switched using spin transfer. Thus, a switching current may be driven through the magnetic junction 120. Based on the direction of the current, the magnetic junction 120 may be switched between the two states shown in FIGS. 2B and 2C. In other embodiments, a combination of a current and a magnetic field may be used to switch the magnetic junction 120. In another embodiment, a magnetic field only may be used to switch the state of the magnetic junction 120.

Figure 2D:
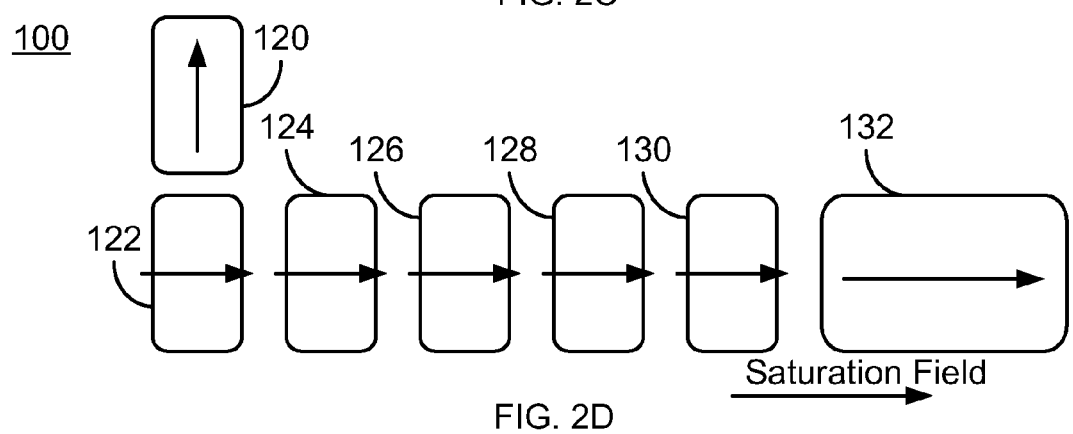
Figure 2E:
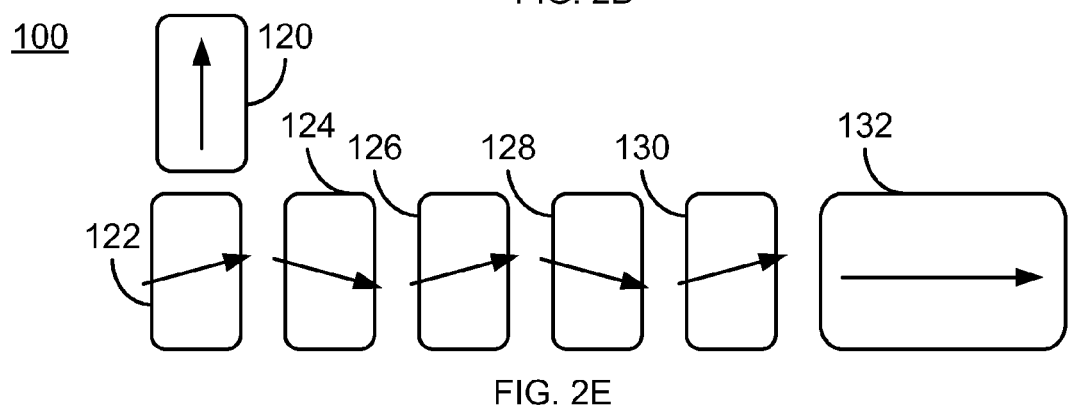
Figure 2F:
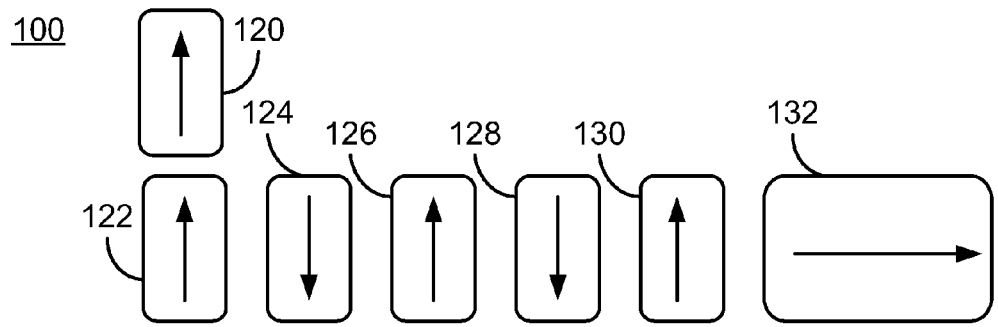

A saturation field may then be applied in the hard axis direction. The magnetic moments of the junctions 122, 124, 126, 128, and 130 align with the magnetic field. This situation is shown in FIG. 2D. Upon removal of the magnetic field, the moments of the junctions 122, 124, 126, 128 and 130 cant away from the hard axis. Because of the interaction between the magnetic junction 120 and the magnetic junction 122, the magnetic junctions 120 and 122 tend to begin to be aligned. This is shown in FIG. 2E. The magnetic junctions 122, 124, 126, 128, 130 then align as shown in FIG. 2F. Thus, a change in the state of the input magnetic junction 120 is reflected in the output magnetic junction 130.

Because the easy axes of the magnetic junctions 120, 122, 124, 126, 128, and 130 are aligned, the magnetic junction 120 has equilibrium states with the magnetic moment parallel or antiparallel to the pinned layer 106. Thus, spin transfer may be used to switch the input magnetic junction 120. Inadvertent write and other issues relating to use of a magnetic field to write to the input junction 120 may be avoided. Further, the configuration of the junctions 120, 122, 124, 126, and 128 provides wider margins. More specifically, a smaller external field may be used to saturate the magnetizations of the junctions 122, 124, 126, and 128 along the hard axis. Further, a larger external magnetic field may be used without switching the input junction 120. As a result, a larger range of external magnetic fields may be used to saturate the magnetic junctions 122, 124, 126 and 128 along their hard axes. Programming the nonvolatile logic device 100 may thus be easier. Performance of the nonvolatile logic device 100 may thus be enhanced.

Figure 3A:
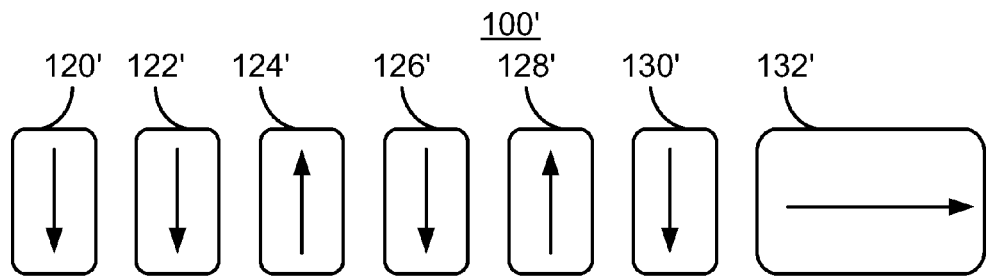
FIGS. 3A-3B depict top and cross-sectional views of another exemplary embodiment of a nonvolatile logic device.
Figure 3B:
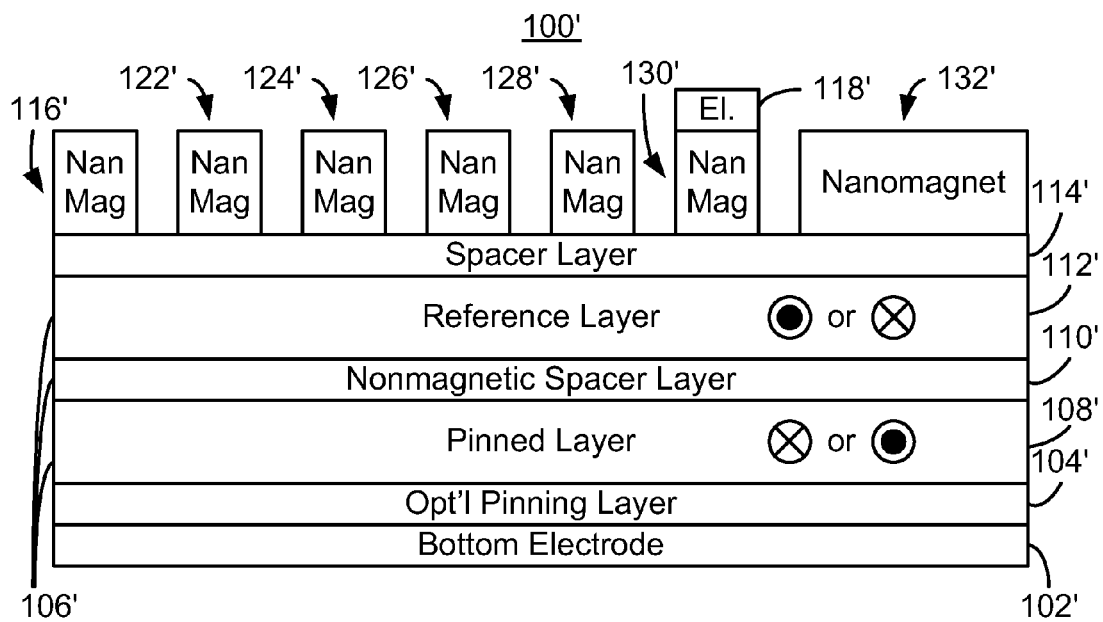

FIGS. 3A-3B depict top and cross-sectional views of another exemplary embodiment of a nonvolatile logic device 100'. For clarity, FIGS. 3A-3B are not to scale. The nonvolatile logic device 100' is analogous to the nonvolatile logic device 100. Consequently, analogous components are labeled similarly. The nonvolatile logic device 100' thus includes a bottom electrode 102', an optional pinning layer 104', a pinned layer 106' including layers 108', 110', and 112', a spacer layer 114', a top layer 116' forming junctions 120', 122', 124', 126', 128', 130', and 132' that correspond to the bottom electrode 102, the optional pinning layer 104, the pinned layer 106 including layers 108, 110, and 112, the spacer layer 114', the top layer 116' forming junctions 120, 122, 124, 126, 128, 130, and 132.

The structure and function of the components 102', 104', 106', 108', 110', 112', 114', 116', 120', 122', 124', 126', 128', 130', and 132' are analogous to the structure and function of the components 102, 104, 106, 108, 110, 112, 114, 116, 120, 122, 124, 126, 128, 130, and 132, respectively. However, the arrangement of the magnetic junctions 120', 122', 124', 126', 128', 130', and 132' differs. The junctions 120', 122', 124', 126', 128', and 130' form a linear array. Stated differently, the junctions 120', 122', 124', 126', 128', and 130' are arranged in a line. This is in contrast to the junctions 120, 122, 124, 126, 128, and 130, which are not collinear. Instead, the junction 120 is aligned with the junction 122 at a right angle from the line formed by the remaining junctions 122, 124, 126, 128, and 130.

The nonvolatile logic device 100' shares the benefits of the nonvolatile logic device 100. Thus, performance of the nonvolatile logic device 100' is improved. However, note that the increase in the range of the external magnetic field may not be achieved.

Figure 4:
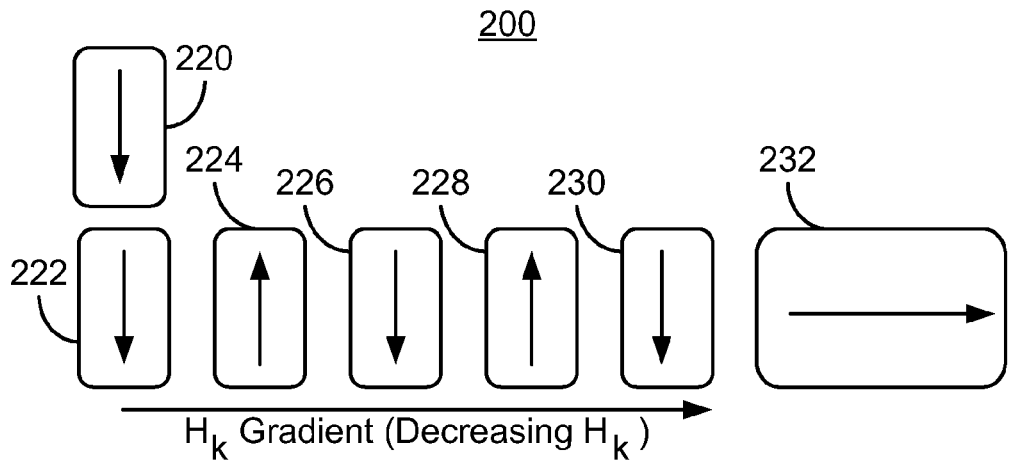
FIG. 4 depicts a top view of another exemplary embodiment of a nonvolatile logic device.

FIG. 4 depicts a top view of another exemplary embodiment of a nonvolatile logic device 200 that is analogous to the nonvolatile logic devices 100 and 100'. For clarity, only a top view is shown and FIG. 4 is not to scale. The nonvolatile logic device 200 is analogous to the nonvolatile logic devices 100 and 100'. Consequently, analogous components are labeled similarly. The nonvolatile logic device 200 thus includes magnetic junctions 220, 222, 224, 226, 228, 230, and 232 that correspond to the junctions 120, 122, 124, 126, 128, 130, and 132, respectively. Although shown arranged as in the nonvolatile logic device 100, the junctions 220, 222, 224, 226, 228, 230 and 232 could be arranged as in the nonvolatile logic device 100'.

The nonvolatile logic device 200 has a magnetic anisotropy ($H_k$) gradient. In particular, the $H_k$ of the magnetic junctions 222, 224, 226, 228, and 230 decreases from the junction 222 to the output junction 230. The decrease in $H_k$ is monotonic. Thus each junction has a lower $H_k$ than the junction immediately to the left. In order, from highest to lowest $H_k$, the junctions are 222, 224, 226, 228, and 230. The manner in which the Hk decreases may vary. For example, the $H_k$ may decrease linearly or in any other manner. The change in $H_k$ in the magnetic junctions 222, 224, 226, 228, and 230 might be due to a change in the shape anisotropy, the magnetic moment, the crystalline anisotropy, an applied field other than that used in switching the nonvolatile logic device, another factor influencing $H_k$ or some combination thereof.

A monotonic decrease in $H_k$ between the first magnetic junction 222 and the output magnetic junction 230 improves the switching characteristics of the nonvolatile logic device 200. In particular, such a gradient in $H_k$ ensures that the magnetic junctions 222, 224, 226, 228, and 230 switch in order. Thus, the magnetic junction 222 closest to the input junction 220 switches first, then the magnetic junction 224, then the magnetic junction 226, followed by the magnetic junction 228, and then output magnetic junction 230. This results in more reliable switching.

As discussed above, the input magnetic junction 220 is switched, an external magnetic field is applied to saturate the junctions 222, 224, 226, 228 and 230, and then the external magnetic field is removed. When the external field is applied, the magnetic junctions 222, 224, 226, 228, and 230 saturate in order from lowest $H_k$ to highest $H_k$. As a result, the magnetic junction 222 closest to the input magnetic junction 220 saturates last. However, all magnetic junctions 222, 224, 226, 228, and 230 are saturated along the hard axis. Upon removal of the external magnetic field, the magnetic junction having the highest $H_k$ selects a state first. The remaining junctions select their states based on the $H_k$, with the highest $H_k$ selecting a state first. Thus, the magnetic junction 222 selects its state first. This state selected is based upon the state of the input magnetic junction 220. Next, the magnetic junction 224 selects its state based upon the state of the magnetic junction 222. The magnetic junction 226 then selects its state based upon the state of the magnetic junction 224. The magnetic junction 228 then selects its state based upon the state of the magnetic junction 226. Finally, the output junction 230 selects its state based upon the state of the magnetic junction 228. Thus, the magnetic junctions 222, 224, 226, 228, and 230 select their states in order, with the junctions closer to the input magnetic junction 220 selecting their state before a junction further from the input magnetic junction 220. The junctions closer to the input magnetic junction also influence the magnetic state of magnetic junctions further from the input magnetic junction. Because the magnetic junctions 222, 224, 226, 228, and 230 select their states in order, information is transferred magnetically from the input magnetic junction 220, to the magnetic junction 222, then to the magnetic junction 224, then to the magnetic junction 226, then to the magnetic junction 228, and finally to the output magnetic junction 230. As a result, information is more reliably transferred through the nonvolatile logic device. Thus, the gradient in $H_k$ in the junctions 222, 224, 226, 228, and 230 may improve reliability of the nonvolatile logic device 200. Thus, in addition to the other benefits of the nonvolatile logic devices 100 and/or 100', the nonvolatile logic device 200 may be more reliable.

Figure 5:
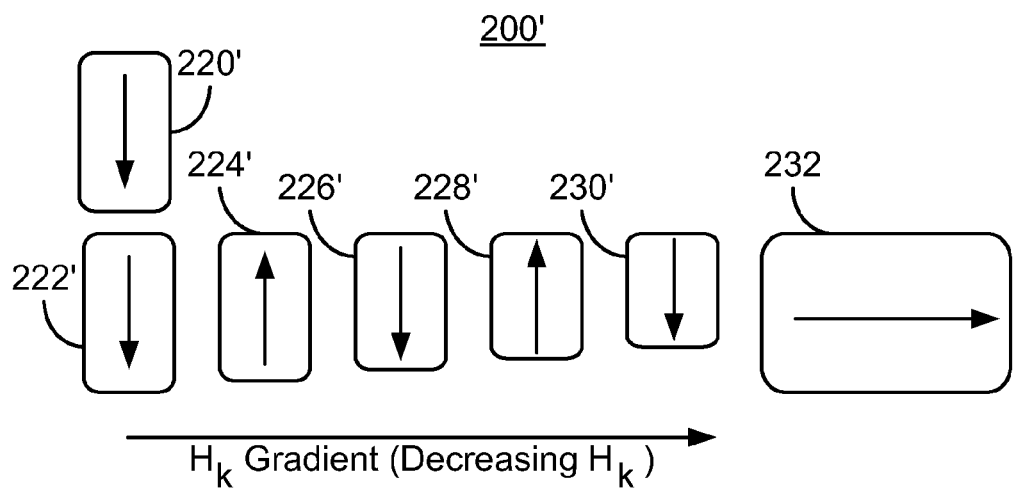
FIG. 5 depicts a top view of another exemplary embodiment of a nonvolatile logic device.

FIG. 5 depicts a top view of another exemplary embodiment of a nonvolatile logic device 200'. The nonvolatile logic device 200' is analogous to the device 200. For clarity, only a top view is shown and FIG. 5 is not to scale. The nonvolatile logic device 200' is also analogous to the nonvolatile logic devices 100 and 100'. Consequently, analogous components are labeled similarly. The nonvolatile logic device 200' thus includes magnetic junctions 220', 222', 224', 226', 228', 230', and 232' that correspond to the junctions 120/220, 122/222, 124/224, 126/226, 128/228, 130/230, and 132/232, respectively. Although shown arranged as in the nonvolatile logic device 100, the junctions 220', 222', 224', 226', 228', 230' and 232' could be arranged as in the nonvolatile logic device 100'.

The nonvolatile logic device 200' has an $H_k$ gradient. In particular, the $H_k$ of the magnetic junctions 220', 222', 224', 226', 228', and 230' decrease from the input junction 220' to the output junction 230'. The decrease in $H_k$ is monotonic and, in the nonvolatile logic device 200', due to a change in the shape anisotropy. In particular, the length/long axis of the magnetic junctions 222', 224', 226', 228', and 230' decreases while the width stays relatively constant. Although not to scale, these changes are shown in FIG. 5. Because of the changes in the magnetic anisotropy, the nonvolatile logic device 200' may have improved reliability in addition to the other benefits of the nonvolatile logic device 200.

Figure 6:
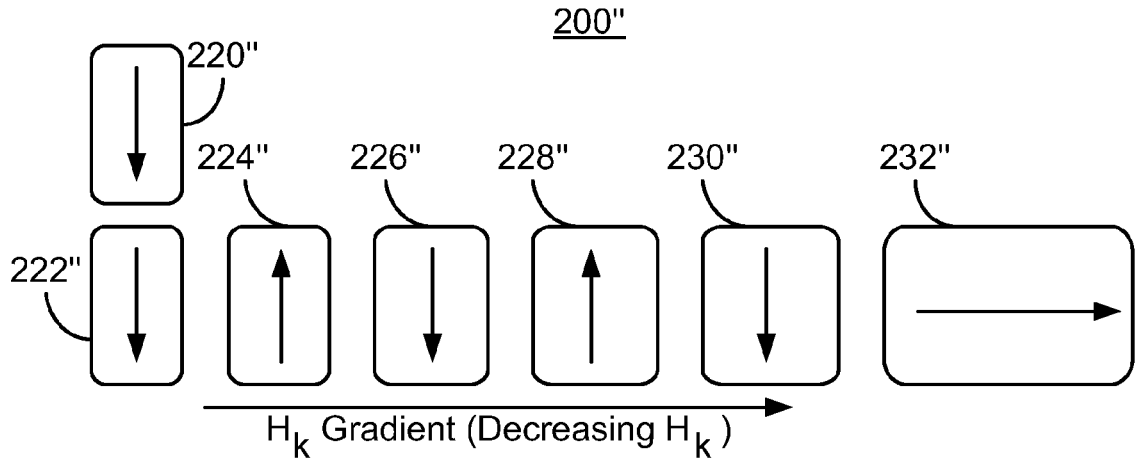
FIG. 6 depicts a top view of another exemplary embodiment of a nonvolatile logic device.

FIG. 6 depicts a top view of another exemplary embodiment of a nonvolatile logic device 200". The nonvolatile logic device 200" is analogous to the device 200. For clarity, only a top view is shown and FIG. 6 is not to scale. The nonvolatile logic device 200" is also analogous to the nonvolatile logic devices 100 and 100'. Consequently, analogous components are labeled similarly. The nonvolatile logic device 200" thus includes magnetic junctions 220", 222", 224", 226", 228", 230", and 232" that correspond to the junctions 120/220/220', 122/222', 124/224/224', 126/226/226', 128/228/228', 130/230/230', and 132/232/232', respectively. Although shown arranged as in the nonvolatile logic device 100, the junctions 220", 222", 224", 226", 228", 230" and 232" could be arranged as in the nonvolatile logic device 100'.

The nonvolatile logic device 200" has an $H_k$ gradient. In particular, the $H_k$ of the magnetic junctions 220", 222", 224", 226", 228", and 230" decrease from the input junction 220" to the output junction 230". The decrease in $H_k$ is monotonic and, in the nonvolatile logic device 200", due to a change in the shape anisotropy. In particular, the width/short axis of the magnetic junctions 222", 224", 226", 228", and 230" increases while the length stays relatively constant. Although not to scale, these changes are shown in FIG. 6. Because of the changes in the magnetic anisotropy, the nonvolatile logic device 200" may have improved reliability in addition to the other benefits of the nonvolatile logic device 200/200'.

Figure 7:
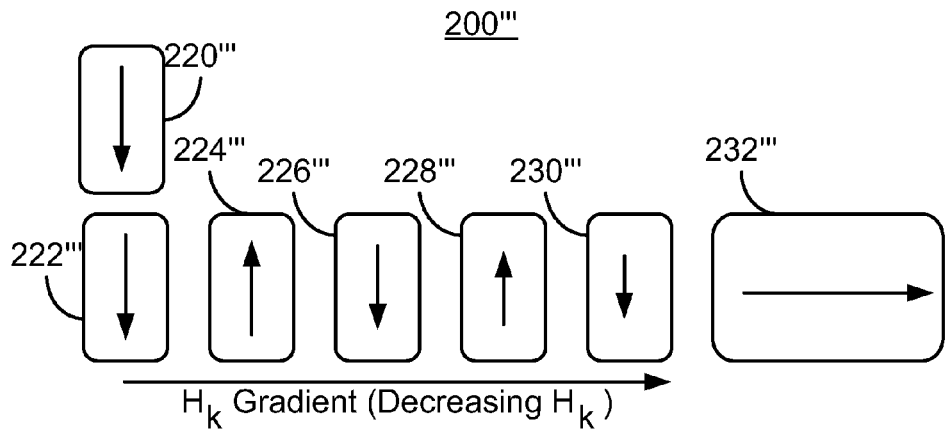
FIG. 7 depicts a top view of another exemplary embodiment of a nonvolatile logic device.

FIG. 7 depicts a top view of another exemplary embodiment of a nonvolatile logic device 200'''. The nonvolatile logic device 200''' is analogous to the device 200. For clarity, only a top view is shown and FIG. 7 is not to scale. The nonvolatile logic device 200''' is also analogous to the nonvolatile logic devices 100 and 100'. Consequently, analogous components are labeled similarly. The nonvolatile logic device 200''' thus includes magnetic junctions 220''', 222''', 224''', 226''', 228''', 230''', and 232''' that correspond to the junctions 120/220/220'/220", 122/222'/222", 124/224/224'/224", 126/226/226'/226", 128/228/228'/228", 130/230/230'/230", and 132/232/232'/232", respectively. Although shown arranged as in the nonvolatile logic device 100, the junctions 220''', 222''', 224''', 226''', 228''', 230''' and 232''' could be arranged as in the nonvolatile logic device 100'.

The nonvolatile logic device 200''' has an $H_k$ gradient. In particular, the $H_k$ of the magnetic junctions 220''', 222''', 224''', 226''', 228''', and 230''' decrease from the input junction 220''' to the output junction 230'''. The decrease in $H_k$ is monotonic and, in the nonvolatile logic device 200''', due to a change in the magnetic moment. In particular, the magnetic moment of the magnetic junctions 222''', 224''', 226''', 228''', and 230''' decreases while the length stays relatively constant. Although not to scale, these changes are shown in FIG. 7. Because of the changes in the magnetic anisotropy, the nonvolatile logic device 200''' may have improved reliability in addition to the other benefits of the nonvolatile logic device 200/200'/200".

Figure 8:
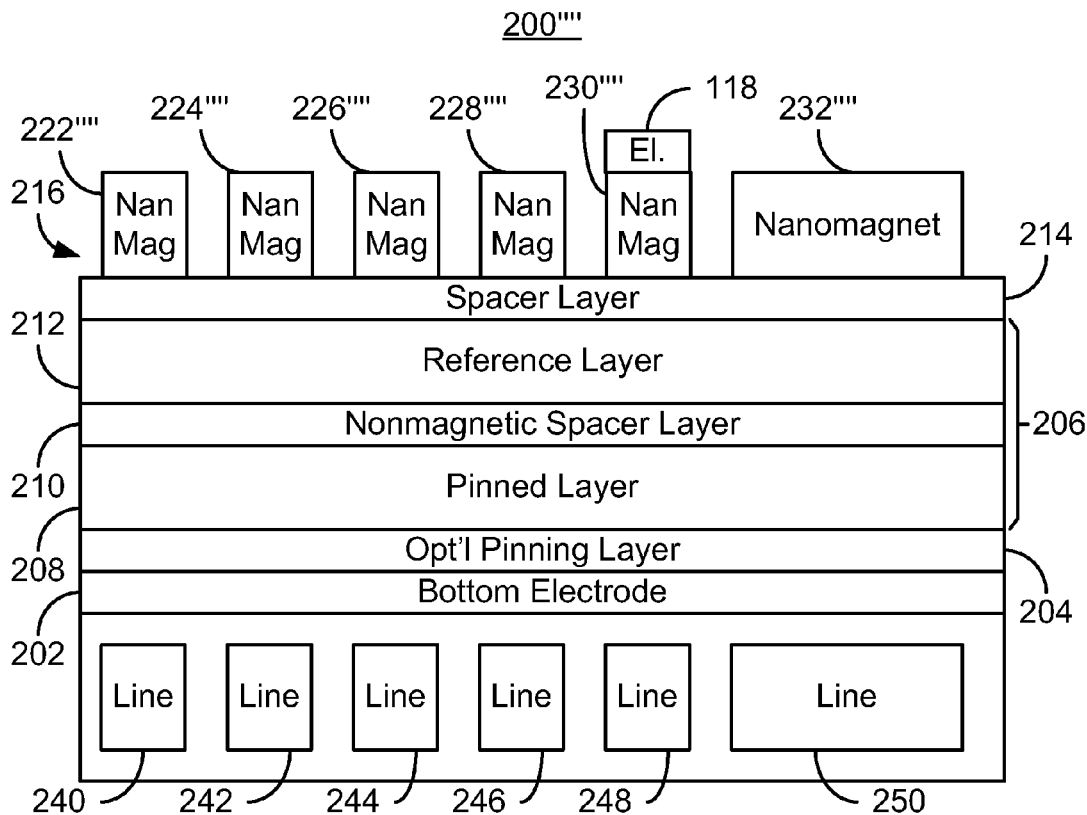
FIG. 8 depicts a side view of another exemplary embodiment of a nonvolatile logic device.

FIG. 8 depicts a side view of another exemplary embodiment of a nonvolatile logic device 200''''. The nonvolatile logic device 200'''' is analogous to the device 200. For clarity, only a top view is shown and FIG. 8 is not to scale. The nonvolatile logic device 200'''' is also analogous to the nonvolatile logic devices 100 and 100'. Consequently, analogous components are labeled similarly. The nonvolatile logic device 200'''' thus includes magnetic junctions 222'''', 224'''', 226'''', 228'''', 230'''', and 232'''' that correspond to the junctions 122/222'/222"/222''', 124/224/224'/224"/224''', 126/226/226'/226"/226''', 128/228/228'/228"/228''', 130/230/230'/230"/230''', and 132/232/232'/232"/232''', respectively. In addition, although not shown, an input magnetic junction analogous to the input magnetic junctions 220/220'/220" is also included. Although shown arranged as in the nonvolatile logic device 100, the junctions 220'''', 222'''', 224'''', 226'''', 228'''', 230'''' and 232'''' could be arranged as in the nonvolatile logic device 100'. Also shown are bottom electrode 202, optional pinning layer 204, pinned layer 206 including layers 208, 210, and 212, spacer layer 214, and layer 216 that are analogous to layers 102, 104, 106 (including layers 108, 110, and 112), 114, and 116, respectively. The nonvolatile logic device 200'''' also includes current lines 240, 242, 244, 246, 248, and 250 corresponding to magnetic junctions 222, 224, 226, 228, 230, and 232, respectively.

The nonvolatile logic device 200'''' has an $H_k$ gradient. In particular, the $H_k$ of the magnetic junctions 220'''', 222'''', 224'''', 226'''', 228'''', and 230'''' decrease from the input junction (not shown) to the output junction 230''''. The decrease in $H_k$ is monotonic and, in the nonvolatile logic device 200'''', due to a biasing magnetic field applied by the lines 240, 242, 244, 246, and 248. In particular, the lines 240, 242, 244, 246, and 248 provide a magnetic field that can bias the magnetic junctions 222"", 224"", 226"", 228"", and 230"". This biasing magnetic field acts as an anisotropy on the magnetic junction 222"", 224"", 226"", 228"", and 230"", respectively. Further, the biasing fields need not be constant. Instead, the fields can be applied at different times. For example, the line 240 might be energized first, followed by the lines 242, 244, 246, and 248 in this order. Further, the timing of these fields may correspond to the times at which the junctions 222"", 224"", 226"", 228"", and 230"" select their state. Because of the changes in the magnetic anisotropy, the nonvolatile logic device 200"" may have improved reliability in addition to the other benefits of the nonvolatile logic device 200/200'/200"/200"'.

Figure 9:
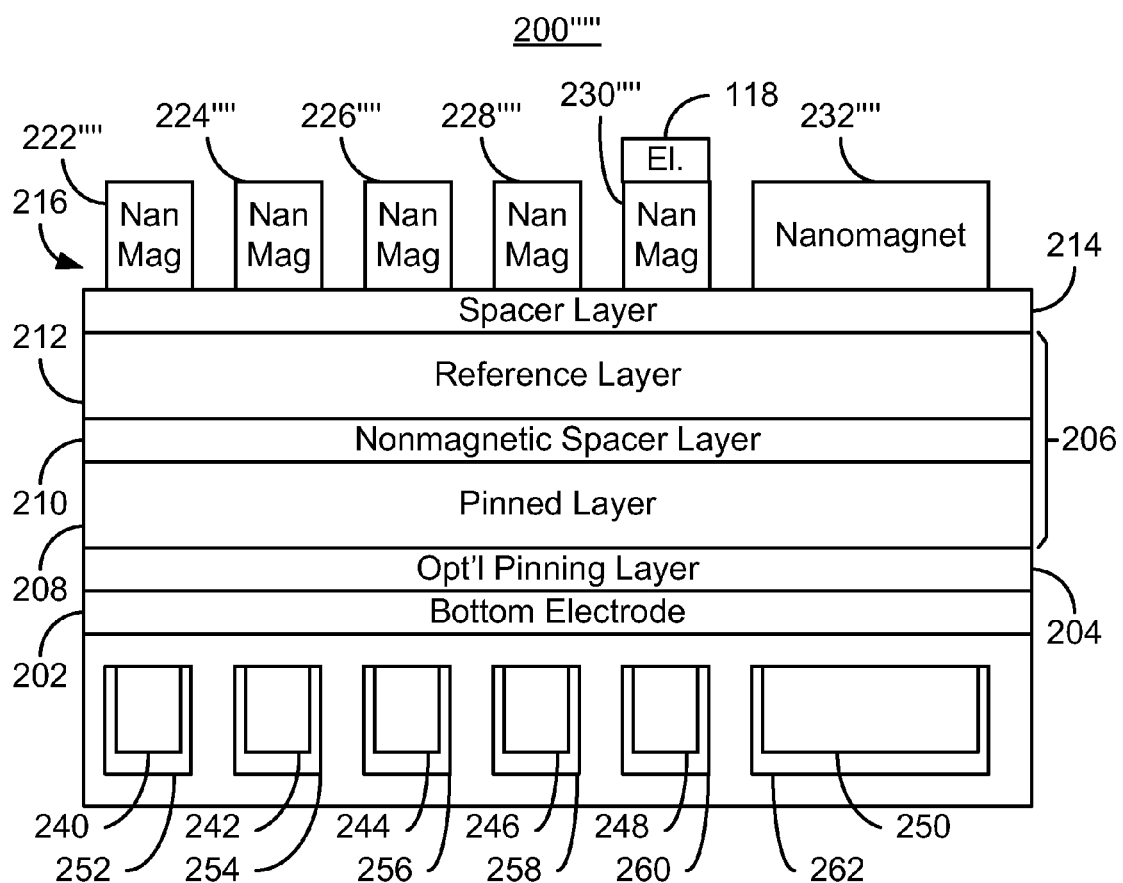
FIG. 9 depicts a side view of another exemplary embodiment of a nonvolatile logic device.

FIG. 9 depicts a side view of another exemplary embodiment of a nonvolatile logic device 200''''. The nonvolatile logic device of FIG. 9 is substantially the same as the device 200"" of FIG. 8. However, the lines 240, 242, 244, 246, 248, and 250 have magnetic cladding 252, 254, 256, 258, 260, and 262, respectively. The cladding 252, 254, 256, 258, 260, and 262 resides on at least the sides and bottoms of the lines 240, 242, 244, 246 248, and 250, respectively. Because the cladding 252, 254, 256, 258, 260, and 262 is magnetic, the magnetic field provided by the cladding 252, 254, 256, 258, 260, and 262 is enhanced. Thus, the magnetic field provided by the lines 240, 242, 244, 246, and 248 may also be increased. Because of the changes in the magnetic anisotropy, the nonvolatile logic device 200'''' may have improved reliability in addition to the other benefits of the nonvolatile logic device 200/200'/200"/200"'/200"". Thus, the nonvolatile logic devices 100, 100', 200, 200', 200", 200"', 200"", and 200'''' may have improved performance and reliability.

Figure 10:
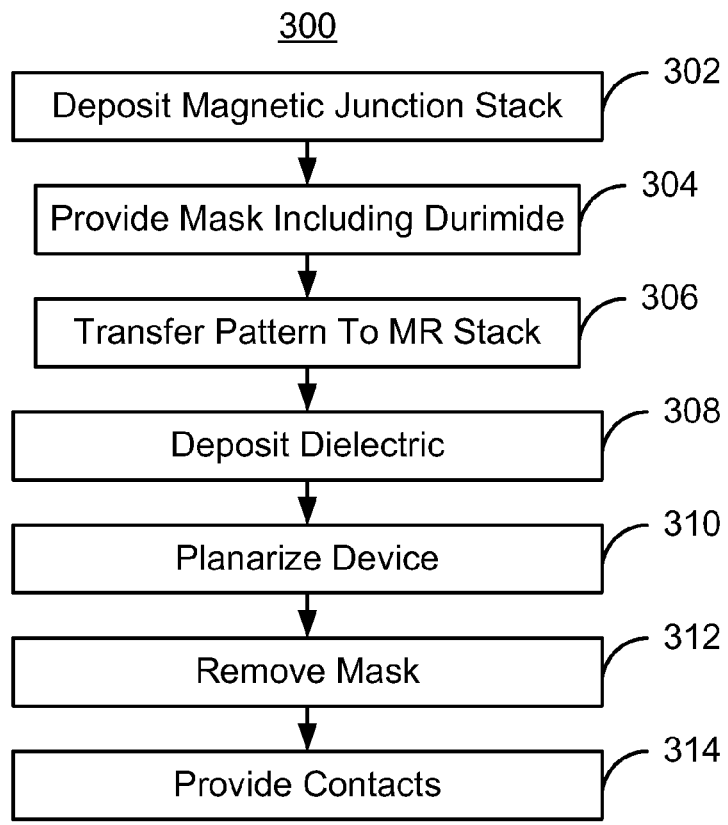
FIG. 10 depicts an exemplary embodiment of a method for providing a nonvolatile logic device.

FIG. 10 depicts an exemplary embodiment of a method 300 for providing a nonvolatile logic device. The method 300 is described in the context of the nonvolatile logic device 100. However, other devices including but not limited to the devices 100', 200, 200', 200", 200"', 200"" and/or 200'''' may be formed. The method 300 is described in the context of particular steps. However, the steps may be omitted, interleaved, combined, or performed in another manner.

A stack for the magnetic junction is deposited, via step 302. The stack includes a pinned layer 106, a spacer layer 114, and layers for a free layer 116. A mask is then provided, via step 304. The mask material is spun on and may include a layer of durimide followed by a layer of a material such as hydrogen silsesquioxane (HSQ). HSQ is a negative tone electron beam resist that may have a high resolution (e.g. on the order of 10 nm) feature sizes and may be cross-linked by exposure to e-beam or EUV radiation with wavelengths shorter than 157 nm. However, other materials might be used. The pattern for the nonvolatile logic device 100 is then transferred to the mask. This step may be performed by providing a photoresist mask, then transferring the pattern to the mask using an electron beam. The pattern of the mask is transferred to the magnetic junction stack, via step 306. Step 306 may include ion milling the magnetoresistive stack. In some embodiments, the stack is milled through. In other embodiments, such as is depicted in the device 100, only some portion of the layers are milled through. For example, only the layer 116 may be milled through. A dielectric is deposited, via step 308. For clarity, this dielectric is not depicted in FIGS. 2A-2F. In some embodiments, the dielectric, such as aluminum oxide, is deposited using atomic layer deposition (ALD) or may be provided as a spin-on glass.

The nonvolatile logic device 100 is then planarized, via step 310. Thus, the durimide portion of the mask is exposed. In some embodiments, step 310 is performed using a chemical mechanical planarization (CMP) or an HSQ process. The mask is removed, via step 312. In some embodiments, step 312 includes etching out the durimide with an oxygen plasma. Contacts may then be provided, via step 314. For example, a mask having apertures in the locations of the contacts may be provided. The apertures may be provided using an electron beam. The contacts may then be deposited and the mask removed.

Using the method 300, the nonvolatile logic device 100 may be provided. This process is similar to that currently used in fabricating magnetic random access memories. As such, the method 300 uses well known processes. However, some issues may remain to be worked out.

Figure 11:
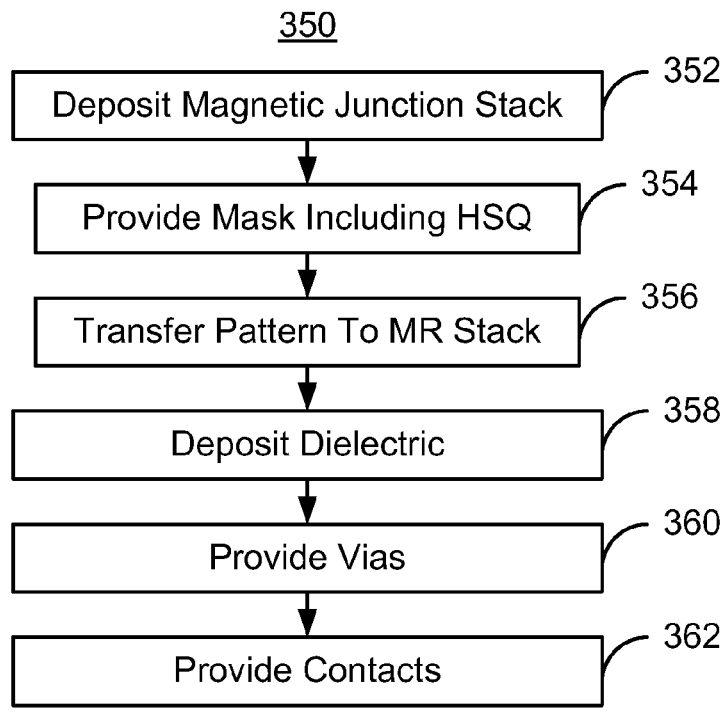
FIG. 11 depicts an exemplary embodiment of a method for providing providing a nonvolatile logic device.

FIG. 11 depicts an exemplary embodiment of a method 350 for providing a nonvolatile logic device. The method 350 is described in the context of the nonvolatile logic device 100. However, other devices including but not limited to the devices 100', 200, 200', 200", 200"', and/or 200"" may be formed. The method 350 is described in the context of particular steps. However, the steps may be omitted, interleaved, combined, or performed in another manner.

A stack for the magnetic junction is deposited, via step 352. The stack includes a pinned layer 106, a spacer layer 114, and layers for a free layer 116. A mask is then provided, via step 354. The mask material is spun on and may include a layer of HSQ. The pattern for the nonvolatile logic device 100 is then transferred to the mask. This step may be performed by providing a photoresist mask, then transferring the pattern to the mask using electron beam lithography. The pattern of the mask is transferred to the magnetic junction stack, via step 356. Step 356 may include ion milling the magnetoresistive stack. In some embodiments, the stack is milled through. In other embodiments, such as is depicted in the device 100, only some portion of the layers are milled through. For example, only the layer 116 may be milled through. A dielectric is deposited, via step 358. For clarity, this dielectric is not depicted in FIGS. 2A-2F. In some embodiments, the dielectric, such as aluminum oxide, is deposited using atomic layer deposition (ALD) or may be provided as a spin-on glass.

Vias may then be provided in the insulator, via step 360. The vias may be opened using electron beam lithography and an oxide reactive ion etch (RIE) process. Contacts may then be provided in the vias, via step 362. For example, a mask having apertures in the locations of the contacts may be provided. The apertures may be provided using an electron beam. The contacts may then be deposited and the mask removed.

Using the method 350, the nonvolatile logic device 100 may be provided without the use of a planarization or additional RIEs. Further, thin vias may be formed. However, additional electron beam patterning is used to form the vias and the HSQ removed using an RIE.

Figure 12:
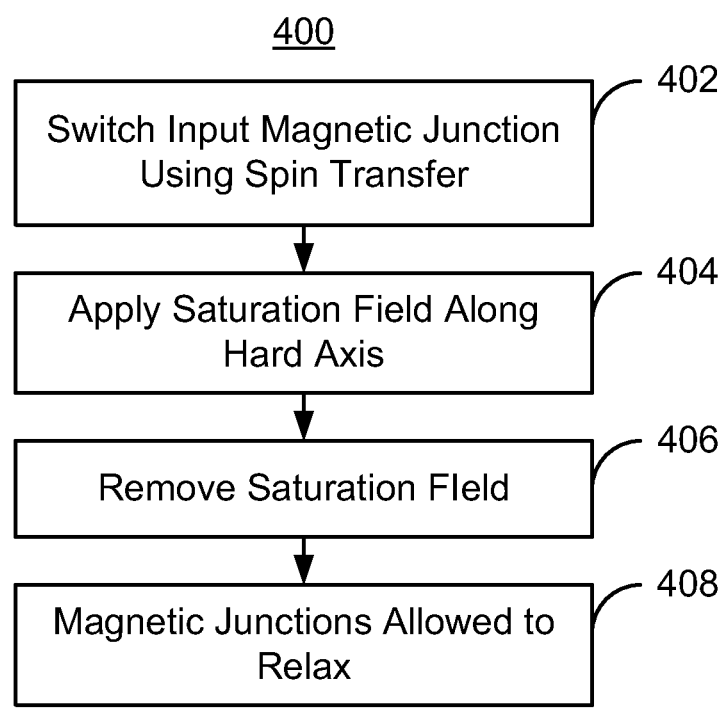
FIG. 12 depicts an exemplary embodiment of a method for programming a nonvolatile logic device.

FIG. 12 depicts an exemplary embodiment of a method 400 for programming a nonvolatile logic device. The method 400 is described in the context of the nonvolatile logic device 100. However, other devices including but not limited to the devices 100', 200, 200', 200", 200"', and/or 200"" may be programmed using the method 400. The method 400 is described in the context of particular steps. However, the steps may be omitted, interleaved, combined, or performed in another manner.

Referring to FIGS. 2A-2F and FIG. 12, the logic device 100 may start in a particular configuration, shown in FIGS. 2A-2B. Alternatively, the logic device might start in the state shown in FIG. 2F. The input magnetic junction 120 is switched using spin transfer, via step 402. In step 402, therefore, a current perpendicular-to-plane (CPP) is driven through the input magnetic junction 120. The direction of current depends upon the state to which the magnetic junction 120 is desired to be switched. In some embodiments, spin transfer may be used in addition to other switching mechanisms including but not limited to applying a field along the easy axis of the input magnetic junction 120. FIG. 2C depicts the nonvolatile memory device 100 after step 402 is performed.

A saturation field is applied in the hard axis direction of the magnetic junctions 122, 124, 126, 128, and 130, via step 404. Thus, the magnetic moments of the junctions 122, 124, 126, 128, and 130 align with the magnetic field. FIG. 2D depicts the nonvolatile device 100 during step 404. Note that because the hard axis field is applied, a lower magnetic field may be used.

The saturation field is removed, via step 406. In some embodiments, the field may be ramped down slowly, while in other embodiments, the field may be cut off more quickly. Upon removal of the magnetic field in step 408, the moments of the junctions 122, 124, 126, 128 and 130 cant away from the hard axis. This situation is depicted in FIG. 2E. Because of the interaction between the magnetic junction 120 and the magnetic junction 122, the magnetic junctions 120 and 122 tend to begin to be aligned.

After a certain (short) time period, the magnetic moments of the magnetic junctions 122, 124, 126, 128, and 130 align with the easy axis and based upon the alignment after removal of the field. Thus, the magnetic moment for the magnetic junction 122 is aligned with the magnetic moment of the input magnetic junction 120. FIG. 2F depicts the new equilibrium state of the nonvolatile magnetic logic device. Thus, a change in the state of the input magnetic junction 120 is reflected in the output magnetic junction 130. As a result, logic operations may be carried out.

Because the easy axes of the magnetic junctions 120, 122, 124, 126, 128, and 130 are aligned, the magnetic junction 120 has equilibrium states with the magnetic moment parallel or antiparallel to the pinned layer 106. Thus, spin transfer may be used to switch the input magnetic junction 120. Inadvertent write and other issues relating to use of a magnetic field to write to the input junction 120 may be avoided. Further, the configuration of the nonvolatile logic device 100 provides wider margins. More specifically, a smaller external field may be used to saturate the magnetizations of the junctions 122, 124, 126, and 128 along the hard axis. Further, a larger external magnetic field may be used without switching the input junction 120. As a result, a larger range of external magnetic fields may be used to saturate the magnetic junctions 122, 124, 126 and 128 along their hard axes. Programming the nonvolatile logic device 100 may thus be easier. Performance of the nonvolatile logic device 100 may thus be enhanced.

A method and system for providing and programming a nonvolatile logic device has been described. Logic gates may be formed from such nonvolatile logic devices. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A nonvolatile logic device comprising:
    an input magnetic junction including an input junction free layer having an input junction easy axis, the input magnetic junction being switchable using a current driven through the magnetic junction;
    an output magnetic junction including an output junction free layer having an output junction easy axis; and
    at least one magnetic junction between the input magnetic junction and the output magnetic junction, each of the at least one magnetic junction including a free layer having an easy axis, the input magnetic junction being magnetically coupled to the output magnetic junction through the at least one magnetic junction.

2. The nonvolatile logic device of claim 1 wherein the input junction easy axis, the output junction easy axis and the easy axis are substantially parallel, each of the at least one magnetic junction further including a hard axis substantially perpendicular to the easy axis.

3. The nonvolatile logic device of claim 1 wherein the input junction easy axis corresponds to an input junction shape anisotropy, the output junction easy axis corresponds to an output junction shape anisotropy, and the easy axis corresponds to a shape anisotropy for each of the at least one magnetic junction.

4. The nonvolatile logic device of claim 1 wherein the input magnetic junction, the at least one magnetic junction, and the output magnetic junction form a linear array.

5. The nonvolatile logic device of claim 1 wherein the at least one magnetic junction and the output magnetic junction form a linear array, the input junction being aligned with a first magnetic junction of the at least one magnetic junction in a direction substantially perpendicular to the linear array.

6. The nonvolatile logic device of claim 1 wherein the input magnetic junction, the at least one magnetic junction, and the output magnetic junction share at least one layer.

7. The nonvolatile logic device of claim 6 wherein the at least one layer includes a pinned layer.

8. The nonvolatile logic device of claim 7 wherein the at least one layer includes a spacer layer.

9. The nonvolatile logic device of claim 6 wherein the spacer layer includes a tunneling barrier layer.

10. The nonvolatile logic device of claim 1 wherein the at least one magnetic junction and the output magnetic junction have a plurality of magnetic anisotropies decreasing monotonically from the input magnetic junction to the output magnetic junction.

11. The nonvolatile logic device of claim 10 wherein the at least one magnetic junction and the output magnetic junction have a plurality of shape anisotropies corresponding to the plurality of magnetic anisotropies.

12. The nonvolatile logic device of claim 11 wherein each of the at least one magnetic junction has a length and a width, the length decreasing from the input magnetic junction to the output magnetic junction.

13. The nonvolatile logic device of claim 11 wherein each of the at least one magnetic junction has a length and a width, the width increasing from the input magnetic junction to the output magnetic junction.

14. The nonvolatile logic device of claim 10 further comprising:
    a plurality of current lines corresponding to the input magnetic junction, the at least one magnetic junction, and the output magnetic junction, the plurality of current lines corresponding to the plurality of magnetic anisotropies.

15. The nonvolatile logic device of claim 14 wherein each of the plurality of current lines is configured to drive a current corresponding to a magnetic anisotropy of the plurality of magnetic anisotropies.

16. The nonvolatile logic device of claim 14 wherein each of the plurality of current lines is configured to start driving the current at a time corresponding to the magnetic anisotropy of the plurality of magnetic anisotropies.

17. The nonvolatile logic device of claim 14 wherein at least a portion of the plurality of current lines includes a primary current conducting portion and a cladding surrounding at least a portion of the primary conducting portion.

18. A method for providing a nonvolatile logic device comprising:
   providing an input magnetic junction including an input junction free layer having an input junction easy axis;
   providing an output magnetic junction including an output junction free layer having an output junction easy axis; and
   providing at least one magnetic junction between the input magnetic junction and the output magnetic junction, each of the at least one magnetic junction including a free layer having an easy axis, the input junction easy axis, the output junction easy axis, and the easy axis being substantially parallel, the input magnetic junction being magnetically coupled to the output magnetic junction through the at least one magnetic junction.

19. The method of claim 18 wherein the input junction easy axis, the output junction easy axis and the easy axis are substantially parallel, each of the at least one magnetic junction further including a hard axis substantially perpendicular to the easy axis.

20. The method of claim 18 wherein the input magnetic junction, the at least one magnetic junction, and the output magnetic junction form a linear array.

21. The method of claim 18 wherein the at least one magnetic junction and the output magnetic junction form a linear array, the input junction being aligned with a first magnetic junction of the at least one magnetic junction in a direction substantially perpendicular to the linear array.

22. The method of claim 18 wherein the input magnetic junction, the at least one magnetic junction, and the output magnetic junction share at least one layer.

23. The method of claim 18 wherein the at least one magnetic junction and the output magnetic junction have a plurality of magnetic anisotropies decreasing monotonically from the input magnetic junction to the output magnetic junction.

24. The method of claim 18 wherein the input magnetic junction is switchable using a spin transfer current driven through the input magnetic junction.

25. The method of claim 18 wherein the input magnetic junction is switchable due to an external magnetic field.

26. A method for programming a nonvolatile logic device including an input magnetic junction, an output magnetic junction and at least one magnetic junction between the input magnetic junction and the output magnetic junction, the input junction having an input junction easy axis, the output junction having an output junction easy axis, each of the at least one magnetic junction including a free layer having an easy axis and a hard axis, the input junction easy axis, the output junction easy axis, and the easy axis being substantially parallel, the input magnetic junction being magnetically coupled to the output magnetic junction through the at least one magnetic junction, the comprising:
   switching at least one magnetic moment of the input magnetic junction from a first state to a second state;
   applying at least one magnetic field along the hard axis of the at least one magnetic junction; and
   removing the magnetic field.

27. The method of claim 26 wherein the step of switching the at least one magnetic moment of the input magnetic junction further includes:
   driving a current through the input magnetic junction in a perpendicular-to-plane orientation.

28. The method of claim 27 wherein the step of switching the at least one magnetic moment of the input magnetic junction further includes switching the input magnetic junction using spin transfer.

29. The method of claim 26 wherein the hard axis is perpendicular to the easy axis.

30. The method of claim 26 wherein the easy axis is substantially parallel to the input junction easy axis and the output junction easy axis.

* * * * *